United States Patent
Wu

(10) Patent No.: US 10,650,723 B2
(45) Date of Patent: May 12, 2020

(54) ARRAY SUBSTRATE AND DISPLAY PANEL

(71) Applicant: XIAMEN TIANMA MICRO-ELECTRONICS CO., LTD., Xiamen (CN)

(72) Inventor: Hao Wu, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 16/157,068

(22) Filed: Oct. 10, 2018

(65) Prior Publication Data
US 2019/0043414 A1 Feb. 7, 2019

(30) Foreign Application Priority Data
Oct. 18, 2017 (CN) .......................... 2017 1 0972151

(51) Int. Cl.
G09G 3/20 (2006.01)

(52) U.S. Cl.
CPC ............. *G09G 3/2092* (2013.01); *G09G 3/20* (2013.01); *G09G 2300/0426* (2013.01); *G09G 2310/0286* (2013.01)

(58) Field of Classification Search
CPC ................... G09G 3/2092; G09G 3/20; G09G 2300/0426; G09G 2310/0286
See application file for complete search history.

(56) References Cited

U.S. PATENT DOCUMENTS

| 2007/0182686 A1* | 8/2007 | Chen ........................ G09G 3/20 345/98 |
| 2016/0232837 A1* | 8/2016 | Lee ....................... G09G 3/3688 |
| 2017/0221435 A1* | 8/2017 | Shima .................. G09G 3/3611 |
| 2018/0067357 A1* | 3/2018 | Katsuta ............. G02F 1/133512 |
| 2018/0204889 A1* | 7/2018 | Yu ........................ G09G 3/3233 |

FOREIGN PATENT DOCUMENTS

CN 100545710 C 9/2009

* cited by examiner

*Primary Examiner* — Liliana Cerullo
(74) *Attorney, Agent, or Firm* — Kilpatrick Townsend & Stockton, LLP

(57) ABSTRACT

The present disclosure provides an array substrate and a display panel. The array substrate includes a display area and a non-display area surrounding the display area. The display area includes a first corner, and data lines extending along a first direction and gate lines extending along a second direction are provided on the display area. The first direction intersects the second direction. The non-display area includes a first non-display area, a second non-display area and a first corner non-display area. The first corner non-display area is adjacent to the first and second non-display areas. The first corner non-display area is adjacent to the first corner. A data end circuit, a first signal line section and a first shift register are located in the first corner non-display area. The data end circuit is disposed at a side of the first shift register close to the display area.

13 Claims, 7 Drawing Sheets

ARRAY SUBSTRATE AND DISPLAY PANEL

CROSS-REFERENCE TO RELATED APPLICATIONS

The present disclosure claims priority to Chinese Patent Application No. 201710972151.7, filed on Oct. 18, 2017, the content of which is incorporated herein by reference in its entirety.

FIELD

The present disclosure relates to the field of display technologies, and in particular, to an array substrate and a display panel.

BACKGROUND

In the existing display panel technologies, generally, there are two main technologies, which are the liquid crystal display panel technology and the organic self-luminous display panel technology. For the liquid crystal display panel, an electric field capable of controlling the deflection of liquid crystal molecules is formed by applying a voltage across the liquid crystal molecules, thereby controlling the transmission of light to achieve the display function of the display panel. For the organic self-luminous display panel, it adopts an organic electroluminescent material, and when current passes through the organic electroluminescent material, the luminescent material emits light, thereby achieving the display function of the display panel.

With the application of display technologies in smart wear and other portable electronic devices, there has been a diversified demand for the appearance of the display panel, and thus an abnormal-shaped display panel has appeared. Compared with a conventional display panel, the abnormal-shaped display panel has a main difference which lies in that its display area has a non-rectangular abnormal shape, such as a circle, a ring, a rhombus, and the like. With the development of technologies, the design of electronic products is constantly pursuing for the smooth experience for the user, and at the same time, it is increasingly pursuing the sensory experience for the user, for example, performances such as the wide viewing angle, the high resolution, the high screen occupancy ratio, and the like have become selling points for the electronic products.

Therefore, providing an array substrate and a display panel to increase the screen occupancy ratio is an urgent problem to be solved in the related art.

SUMMARY

Embodiments of the present disclosure provide an array substrate, and the array substrate includes a display area and a non-display area surrounding the display area. The display area includes a first corner, and data lines extending along a first direction and gate lines extending along a second direction are provided in the display area. The first direction intersects with the second direction. The non-display area includes: a first non-display area, a second non-display area, and a first corner non-display area. The first corner non-display area is adjacent to the first non-display area and the second non-display area, the first non-display area extends along the first direction, and the second non-display area extends along the second direction. The first corner non-display area is adjacent to the first corner, and at least one data end circuit, at least one first signal line section and at least one first shift register are disposed in the first corner non-display area. The at least one data end circuit is disposed at a side of the at least one first shift register close to the display area, and the at least one first signal line section corresponding to and connected to the at least one data end circuit is located at the side of the at least one first shift register close to the display area.

Further embodiments of the present disclosure provide a display panel including any of the array substrates provided by the present disclosure.

BRIEF DESCRIPTION OF DRAWINGS

The accompanying drawings incorporated in and constituting a part of the description illustrate the embodiments of the present disclosure, and are used to interpret the principles of the present disclosure in combination with the description.

DESCRIPTION OF EMBODIMENTS

Figure 1:
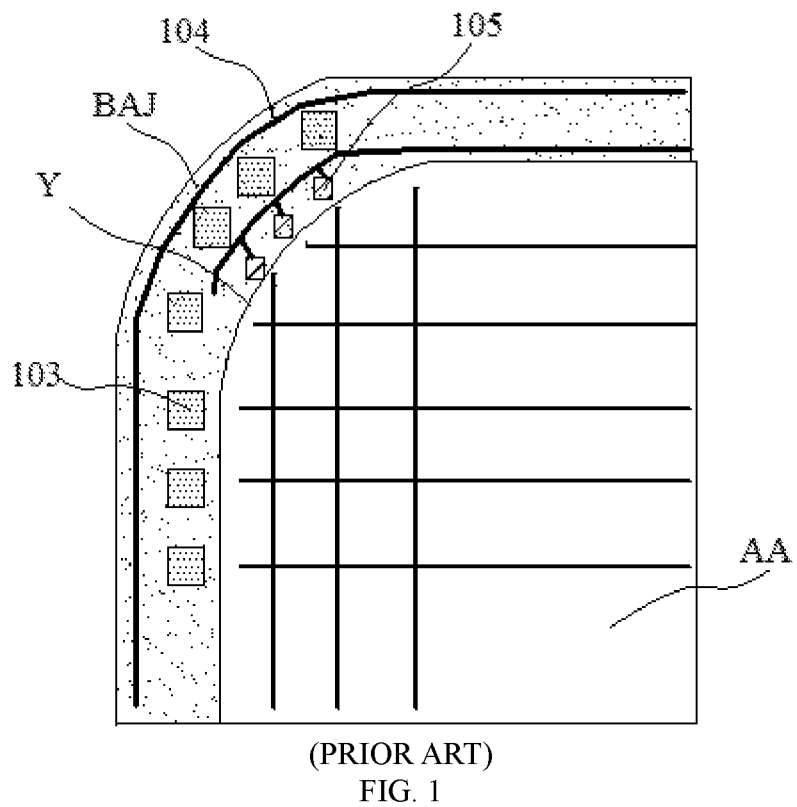
FIG. 1 is a partial top view of an array substrate in the related art.

Embodiments of the present disclosure will now be described in detail with reference to the accompanying drawings. It should be noted that the relative arrangement of the components and steps, numerical expressions and numerical values set forth in the embodiments are not intended to limit the scope of the present disclosure.

The following description with respect to at least one embodiment is merely illustrative, and is not intended to limit applications of the present disclosure It should be noted that similar reference numerals and letters indicate similar items in the following accompanying drawings, and therefore, once an item is defined in one drawing, it will not be further discussed in subsequent drawings.

The present disclosure relates to an array substrate and a display panel. FIG. 1 is a partial top view of an array substrate in the related art. The display area AA at a corner position of the array substrate in FIG. 1 has an abnormal-shaped profile boundary Y, that is, it does not adopt a common right-angle design, but a curvy design, at the corner position of the display area. The non-display area BAJ at the corner position is adjacent to the abnormal-shaped profile boundary Y. Shift registers 103 are disposed along the abnormal-shaped profile boundary Y in the non-display area BAJ at the corner position. A signal line 104 needs to bypass the shift registers 103 along the abnormal-shaped profile boundary Y and then establish a corresponding connection with a data end circuit 105. The inventor found that such a wiring arrangement results in twice wiring of the signal line 104 in the non-display area BAJ at the corner position, which is adverse to narrowing of the border.

In the present disclosure, the wiring arrangement of the signal line in the non-display area of the array substrate can be adjusted to be only once wiring of the signal line in the non-display area at the corner position, thereby reducing space occupied by the signal line in the non-display area (i.e., the corner area), which is beneficial to narrowing of the border and thus increasing the screen occupancy ratio.

Figure 2:
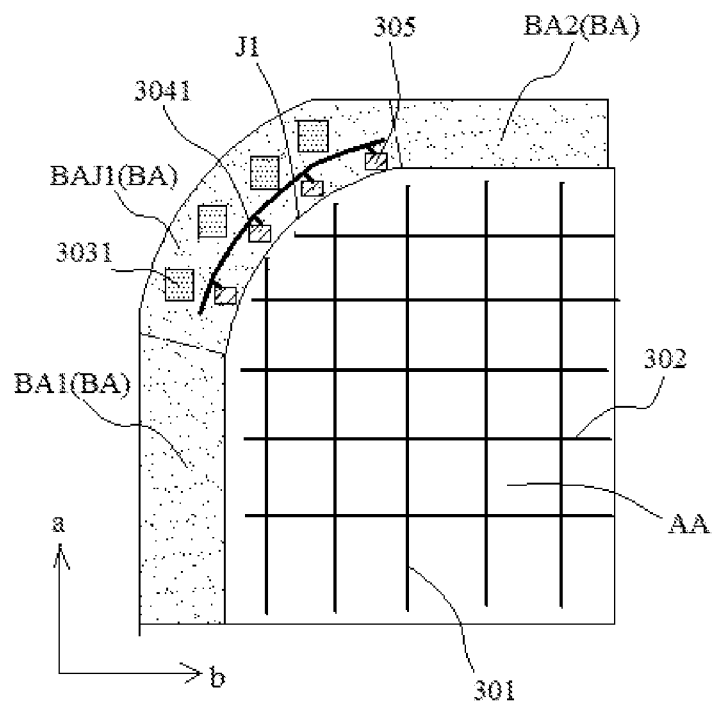
FIG. 2 is a partial top view of an array substrate according to an embodiment of the present disclosure.
Figure 3:
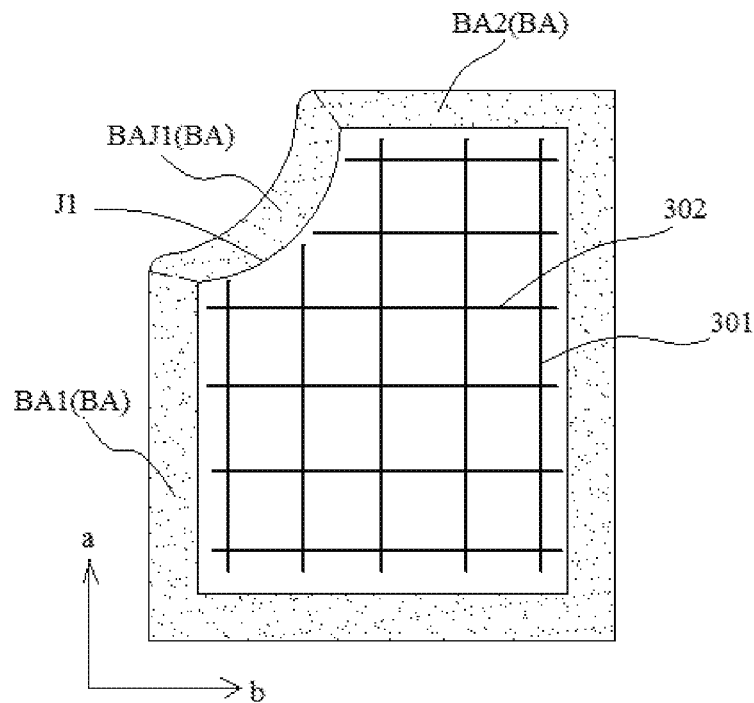
FIG. 3 is a partial top view of an array substrate according to another embodiment of the present disclosure.

The present disclosure provides an array substrate, as shown in FIG. 2 and FIG. 3, where FIG. 2 is a partial top view of an array substrate according to an embodiment of the present disclosure, and FIG. 3 is a partial top view of an array substrate according to another embodiment of the present disclosure.

As shown in FIG. 2, the array substrate includes: a display area AA and a non-display area BA surrounding the display area AA. The display area AA includes a first corner J1, and the first corner J1 may be arc-shaped as shown in FIG. 2 or in any other non-right-angle shape. The display area AA includes data lines 301 extending along a first direction a and gate lines 302 extending along a second direction b, where the first direction a intersects with the second direction b. The non-display area BA includes: a first non-display area BA1, a second non-display area BA2, and a first corner non-display area BAJ1. The first corner non-display area BAJ1 is adjacent to the first non-display area BA1 and the second non-display area BA2. The first non-display area BA1 extends along the first direction a, and the second non-display area BA2 extends along the second direction b. The first corner non-display area BAJ1 is adjacent to the first corner J1. Data end circuit(s) 305, a first signal line section 3041, and first shift register(s) 3031 are disposed in the first corner non-display area BAJ1. The data end circuit(s) 305 is disposed at a side of the first shift register(s) 3031 close to the display area AA. And the first signal line section 3041 corresponding to and connected to the data end circuit(s) 305 is disposed at the side of the first shift register(s) 3031 close to the display area AA. The array substrate includes a signal line for providing a signal to the data end circuit(s) 305, and the first signal line section 3041 is a section of the signal line in the first corner non-display area BAJ1. In the first corner non-display area BAJ1, FIG. 2 merely shows a corresponding connection between the first signal line section 3041 and the data end circuit(s) 305. Here, one first shift register 3031 is connected to at least one gate line 302 (not shown), so as to provide a gate scan signal for the gate line 302.

It should be noted that the first corner J1 and the first corner non-display area BAJ1 are not limited in shapes as shown in FIG. 2, and in embodiments, the corner area of the array substrate may have another abnormal shape. Regarding the meaning of the corresponding reference signs in FIG. 3, please refer to FIG. 2. The abnormal shape in the corner area of the array substrate can enrich a shape of the display panel and realize diversification of the product shape.

In this embodiment, the non-display area includes the first non-display area BA1, the first corner non-display area BAJ1 and the second non-display area BA2 sequentially adjacent to each other. In the first corner non-display area BAJ1 of the array substrate, the data end circuit 305 is disposed at the side of the first shift register 3031 close to the display area AA, and the first signal line section 3041 connected to the data end circuit 305 is disposed at the side of the first shift register 3031 close to the display area AA. Compared with the related art, for the array substrate provided by this embodiment, the first signal line section 3041 providing a signal to the data end circuit 305 does not need to bypass the first shift register 3031 and is then connected to the data end circuit 305, and it requires for only once wiring of the signal line in the first corner non-display area BAJ1, thereby reducing space occupied by the signal line in first corner non-display area BAJ1 and thus achieving narrowing of the non-display area (i.e., the border), increasing the screen occupancy ratio.

Further, in some embodiments, the data end circuit 305 shown in FIG. 2 is an anti-static circuit, and the anti-static circuit is connected to the data line. The array substrate provided by this embodiment is provided with an anti-static circuit, which can prevent the generated static electricity from damaging the circuit components, thereby improving the performance reliability of the product. Meanwhile, in the first corner non-display area BAJ1 of the array substrate, the signal line (i.e., the first signal line section 3041) providing a signal for the anti-static circuit is disposed at the side of the first shift register 3031 close to the display area AA. It requires for only once wiring of the signal line in the first corner non-display area BAJ1, thereby reducing space occupied by the signal line and thus achieving narrowing of the corner non-display area, increasing the screen occupancy ratio.

Further, the array substrate provided by the present disclosure includes a common electrode, and the data end circuit 305 shown in FIG. 2 is a common voltage switch control circuit, which is connected to the common electrode. In the array substrate provided by this embodiment, in the first corner non-display area BAJ1, it requires for only once wiring of the signal line in the first corner non-display area BAJ1, thereby reducing space occupied by the signal line in first corner non-display area, achieving narrowing of the corner area, and increasing the screen occupancy ratio. Meanwhile, the common electrode of the array substrate can be multiplexed as the touch electrode to implement the touch function. The first signal line section 3041 provides a signal to the common voltage switch control circuit, so as to control the common electrode to be in a display stage or in a touch sensing stage. The common electrode can be reused as the touch electrode, and thus it is not necessary to separately form the touch electrode layer, thereby reducing a thickness of the array substrate, which is beneficial to thinning the display panel.

Figure 4:
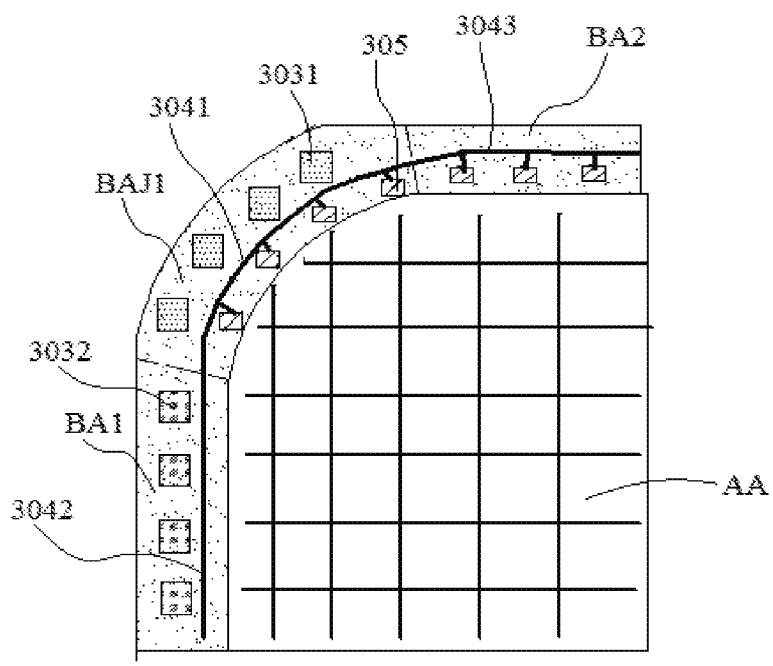
FIG. 4 is a partial schematic diagram of an array substrate according to still another embodiment of the present disclosure.

Further, in some embodiments, FIG. 4 is a partial top view of an array substrate according to still another embodiment of the present disclosure. As shown in FIG. 4, the first non-display area BA1 is provided therein with a second signal line section 3042 and second shift register(s) 3032. The second signal line section 3042 is disposed at a side of the second shift register 3032 close to the display area AA. The second non-display area BA2 is provided therein with data end circuit(s) 305. A third signal line section 3043 provides a signal for the data end circuit(s) 305 in the second non-display area BA2. The array substrate provided by the present disclosure includes a signal line, and the signal line includes the first signal line section 3041, the second signal line section 3042, and the third signal line section 3043. The first signal line section 3041 is connected to the second signal line section 3042 and the third signal line section 3043. The third signal line section 3043 is a section of the signal line in the second non-display area BA2. The second signal line section 3042 is a section of the signal line in the first non-display area BA1. The second signal line section 3042 is connected to the first signal line section 3041. In the array substrate of the present disclosure, one of the second shift register(s) 3032 is connected to at least one gate line so as to provide a gate scan signal to the gate line. In the array substrate provided by this embodiment, the second signal line section 3042 in the first non-display area BA1 is connected to the first signal line section 3041 in the first corner non-display area BAJ1, so as to provide a signal for the data end circuit 305 in the first corner non-display area BAJ1. Here, the second signal line section 3042 is disposed at the side of the second shift register 3032 close to the display area AA. The second signal line section 3042 can be directly connected to the first signal line section 3041 disposed at the side of the first shift register 3031 close to the display area AA. When manufacturing the array substrate, the first signal line section 3041 and the second signal line section 3042 can be manufactured and connected to each other in only one process, and it can achieve that only once wiring of the signal line in the first corner non-display area BAJ1 is provided, thereby reducing space occupied by the signal line in the corner non-display area, which is beneficial to narrowing of the border.

Figure 5:
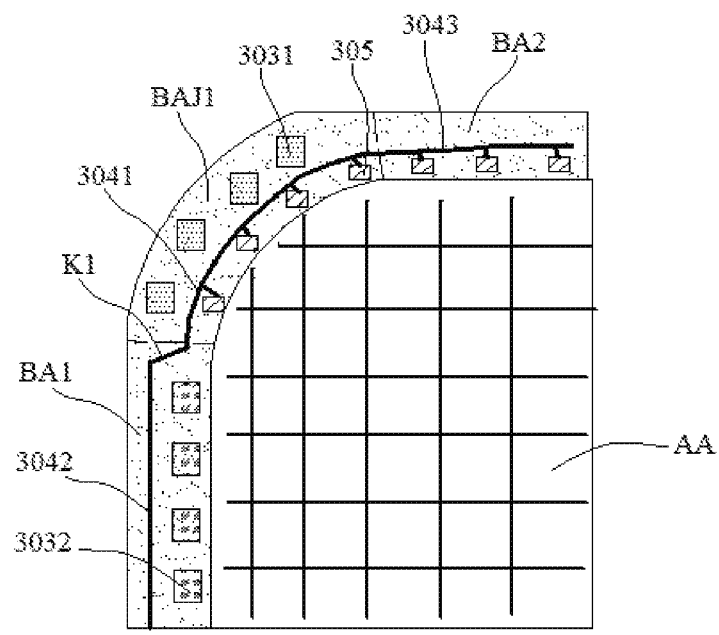
FIG. 5 is a partial schematic diagram of an array substrate according to still another embodiment of the present disclosure.

Further, in some implements, FIG. 5 is a partial top view of an array substrate according to still another embodiment of the present disclosure. As shown in FIG. 5, the first non-display area BA1 is provided therein with a second signal line section 3042 and second shift register(s) 3032. The second signal line section 3042 is disposed at a side of the second shift register 3032 away from the display area AA. The second non-display area BA2 is provided therein with data end circuit(s) 305. The third signal line section 3043 provides a signal to the data end circuit(s) 305 in the second non-display area BA2. The signal line providing the signal for the data end circuit(s) 305 includes the first signal line section 3041, the second signal line section 3042, a first bridge line K1 and the third signal line section 3043. The third signal line section 3043 is connected to the first signal line section 3041. The second signal line section 3042 is connected to the first signal line section 3041 by the first bridge line K1. The first bridge line K1 is disposed at a different metal layer from the first signal line section 3041 and the second signal line section 3042. In this embodiment, the second signal line section 3042 is disposed at the side of the second shift register 3032 away from the display area AA. In order to prevent the connection between the first signal line section 3041 and the second signal line section 3042 from influencing the connection between the shift registers of the array substrate, the second signal line section 3042 may not be extended and then directly connected to the first signal line section 3041 disposed in the first corner non-display area, The first bridge line K1 disposed at the different metal layer from the first signal line section 3041 and the second signal line section 3042 makes the entire signal line to be conductive. Meanwhile, in this embodiment, the second signal line section 3042 in the first non-display area BA1 is disposed at the side of the second shift register 3032 away from the display area AA, which can prevent interference with respect to the display area after current is applied into the second signal line section 3042. In this embodiment, the connection between the first signal line section 3041 and the second signal line section 3042 is realized by means of a bridge connection, thereby achieving that only once wiring of the signal line in the first corner non-display area BAJ1 is provided, and thus reducing space occupied by the signal line in the corner non-display area.

It should be noted that the naming difference between the first shift register and the second shift register in this embodiment of the present disclosure is merely for the purpose of making a distinction that the shift registers are in different non-display areas. When the array substrate is manufactured, the first shift register and the second shift register are manufactured with a same process.

In the present disclosure, an orthographic projection of the first bridge line on the plane of the shift register may be disposed between one first shift register and one second shift register adjacent to each other, that is, the first bridge line may be arranged on a border where the first non-display area is adjacent to the first corner non-display area. In an example, as shown in FIG. 5, the first bridge line K1 may be located in the first non-display area BA1. The first bridge line K1 connects the first signal line section 3041 to the second signal line section 3042, such that in the first corner non-display area BAJ1, the first signal line section 3041 for providing a signal to the data end circuit is disposed at the side of the first shift register 3031 close to the display area AA. There is no other signal line in the first corner non-display area BAJ1, such that only once wiring of the signal line in the first corner non-display area BAJ1 is provided, thereby reducing space occupied by the signal line in the corner non-display area, which is beneficial to narrowing of the border.

In some embodiments, an orthographic projection of the first bridge line on the plane of the second shift register is disposed between two adjacent second shift registers. In the array substrate, the circuit components in the shift register are finely structured. The orthographic projection of the first bridge line, which connects the first signal line to the second signal line, is disposed between two adjacent second shift registers. The first bridge line makes the first signal line section to be connected to the second signal line section, so as to provide a normal signal for the data end circuit, and meanwhile, the shift register will not be interfered by a signal when current passes through the first bridge line, thereby improving the performance reliability of the array substrate.

Figure 6:
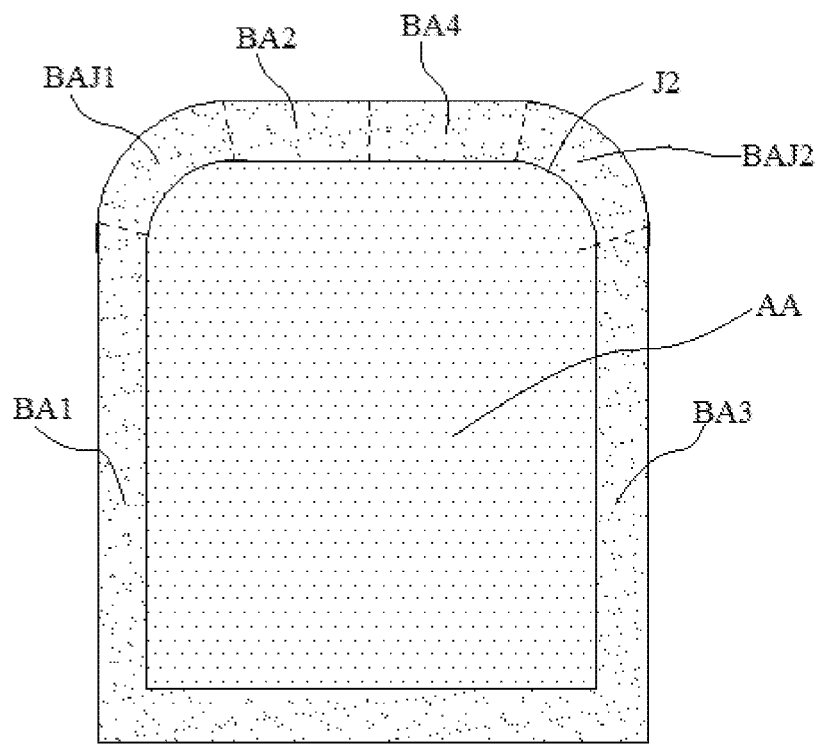
FIG. 6 is a schematic diagram of an array substrate according to still another embodiment of the present disclosure.
Figure 7:
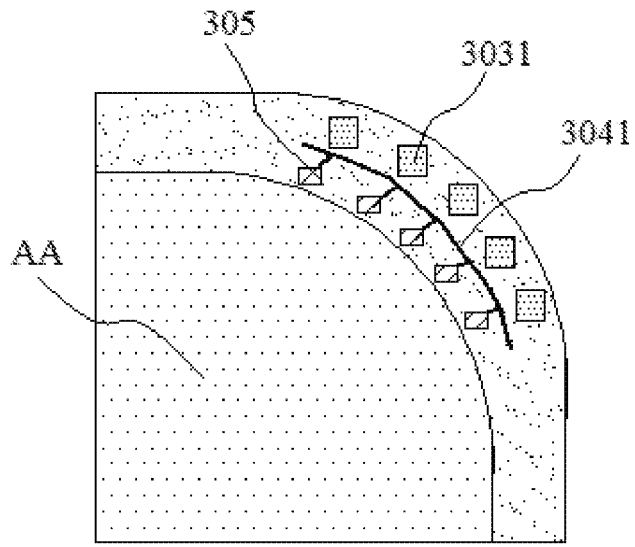
FIG. 7 is a partial enlarged view of a second corner non-display area of FIG. 6.

Further, in another embodiment, as shown in FIG. 6 and FIG. 7, FIG. 6 is a schematic diagram of an array substrate according to still another embodiment of the present disclosure; and FIG. 7 is a partial enlarged view of a second corner non-display area of FIG. 6.

As shown in FIG. 6, the display area includes a second corner J2, and the non-display area BA further includes a third non-display area BA3, a fourth non-display area BA4, and a second corner non-display area BAJ2. The second corner non-display area BAJ2 is adjacent to the third non-display area BA3 and the fourth non-display area BA4. The second corner non-display area BAJ2 is adjacent to the second corner J2. The third non-display area BA3 and the first non-display area BA1 are located at two opposite sides of the display area. The second non-display area BA2 and the fourth non-display area BA4 are disposed at a same side of the display area AA. The second non-display area BA2 and the fourth non-display area BA4 may be adjacent to each other as shown in FIG. 6, or may also be disposed at the same side of the display area AA but not adjacent to each other (this case is a case where the array substrate is designed with a notch as described in the description of the subsequent embodiments).

As shown in FIG. 7, data end circuit(s) 305, a first signal line section 3041, and first shift register(s) 3031 are provided in the second corner non-display area BAJ2. The data end circuit(s) 305 is disposed at a side of the first shift register(s) 3031 close to the display area AA, and the first signal line section 3041 connected to the data end circuit(s) 305 is disposed at the side of the first shift register 3031 close to the display area AA. It requires for only once wiring of the signal line in the second corner non-display area BAJ2 to provide a signal for the data end circuit 305, thereby reducing space occupied by the signal line in the second corner non-display area BAJ2. Meanwhile, it requires for only once wiring of the signal line in the first corner non-display area BAJ1. The array substrate provided by this embodiment achieves narrowing of the left and right corner non-display areas of the array substrate, thereby improving the screen occupancy ratio.

Figure 8:
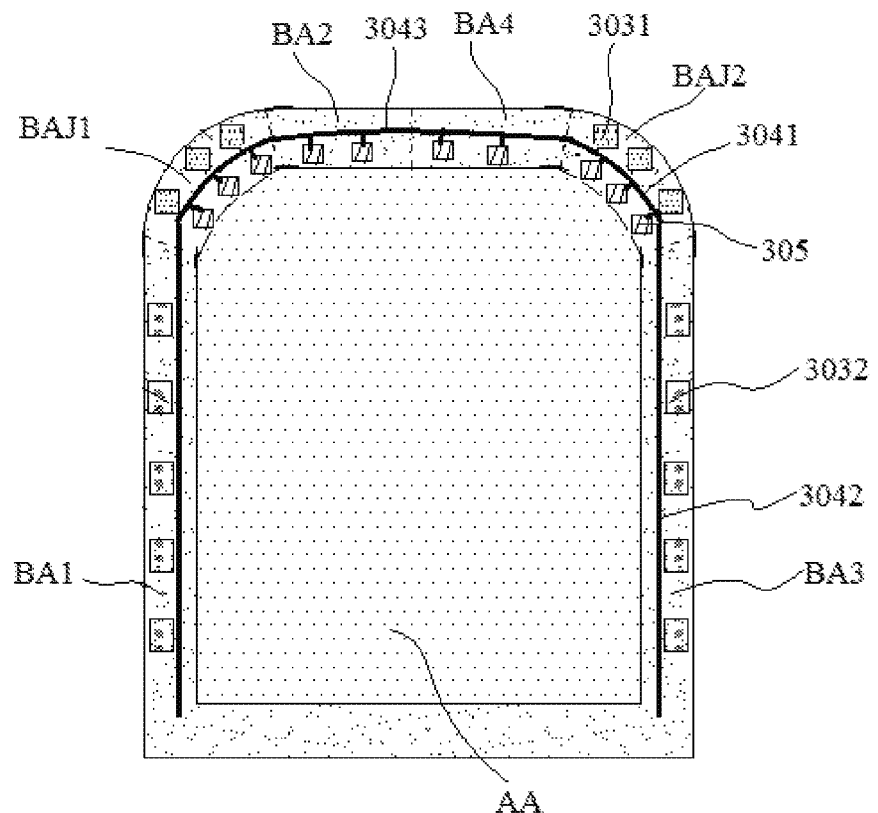
FIG. 8 is a schematic diagram of an array substrate according to still another embodiment of the present disclosure.

Further, in some embodiments, FIG. 8 is a schematic diagram of an array substrate according to still another embodiment of the present disclosure. As shown in FIG. 8, each of the first corner non-display area BAJ1 and the second corner non-display area BAJ2 is provided therein with data end circuits(s) 305, a first signal line section 3041 and first shift register(s) 3031. Each of the first non-display area BA1 and the third non-display area BA3 is provided therein with a second signal line section 3042 and second shift register(s) 3032. The second signal line section 3042 are disposed at a side of the second shift register 3032 close to the display area AA. In the non-display area at the upper side of the array substrate, the second non-display area BA2 is adjacent to the fourth non-display area BA4, each of the second non-display area BA2 and the fourth non-display area BA4 is provided therein with data end circuit(s) 305 and a third signal line section 3043, and the third signal line section 3043 provides a signal for the data end circuits 305 in the second non-display area BA2 and the fourth non-display area BA4, besides, the third signal line sections 3043 are respectively connected to the first signal line sections 3041 in the corner non-display areas at the left and right sides of the array substrate. In the non-display area at the left side of the array substrate, the second signal line section 3042 is connected to the first signal line section 3041 in the first corner non-display area BAJ1. In the non-display area at the right side of the array substrate, the second signal line section 3042 is connected to the first signal line section 3041 in the second corner non-display area BAJ2. The array substrate provided by this embodiment can realize narrowing of the left and right corner non-display areas of the array substrate, thereby improving the screen occupancy ratio, meanwhile, the data line is provided in the first non-display area BA1 and the third non-display area BA3 at both sides of the display area AA of the array substrate, such that the signal line are dispersed at the left and right sides, which is beneficial to narrowing the non-display areas at the left and right sides, and further improving the screen occupancy ratio.

Figure 9:
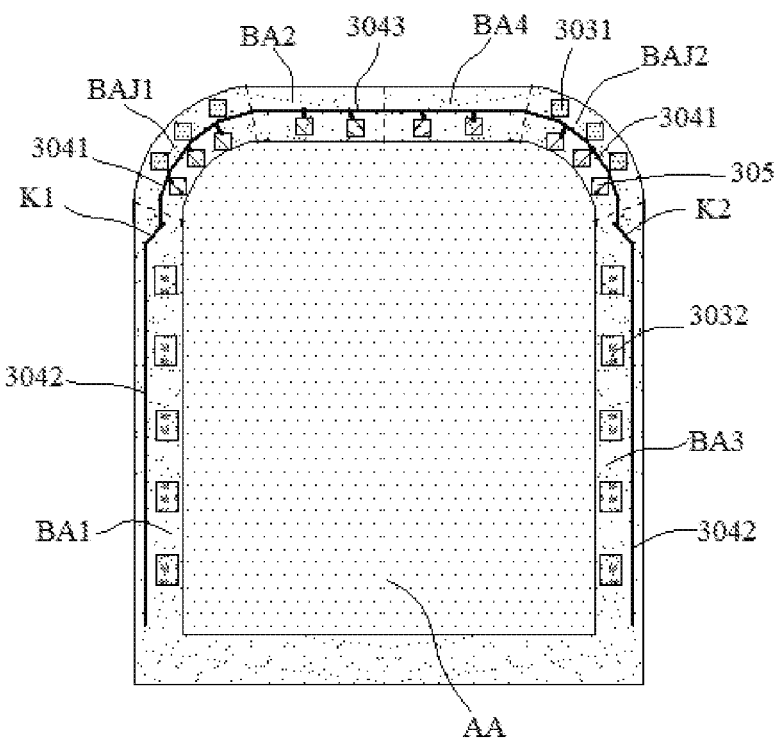
FIG. 9 is a schematic diagram of an array substrate according to still another embodiment of the present disclosure.

Further, in some embodiments, FIG. 9 is a schematic diagram of an array substrate according to still another embodiment of the present disclosure. As shown in FIG. 9, each of the first corner non-display area BAJ1 and the second corner non-display area BAJ2 is provided therein with data end circuits(s) 305, a first signal line section 3041 and first shift register(s) 3031. Each of the first non-display area BA1 and the third non-display area BA3 is provided therein with a second signal line section 3042 and second shift register(s) 3032. The second signal line section 3042 are disposed at a side of the second shift register 3032 away from the display area AA. In the non-display area at the upper side of the array substrate, the second non-display area BA2 is adjacent to the fourth non-display area BA4, and the third signal line section 3043 provides a signal for the data end circuits 305 in the second non-display area BA2 and the fourth non-display area BA4, besides, the third signal line sections 3043 are respectively connected to the first signal line sections 3041 in the corner non-display areas at the left and right sides of the array substrate. In the non-display area at the left side of the array substrate, the second signal line section 3042 is connected to the first signal line section 3041 in the first corner non-display area BAJ1 by a first bridge line K1. In the non-display area at the right side of the array substrate, the second signal line section 3042 is connected to the first signal line section 3041 in the second corner non-display area BAJ2 by a second bridge line K2. The second bridge line K2 is disposed in a different layer from the first signal line section 3041 and the second signal line section. For the array substrate provided by this embodiment, only once wiring of the signal line in the second corner non-display area BAJ2 is provided, and thus realizing narrowing of the left and right corner non-display areas of the array substrate, thereby improving the screen occupancy ratio, meanwhile, the data line is provided in the first non-display area BA1 and the third non-display area BA3 at both sides of the display area AA of the array substrate, such that the signal line are dispersed at the left and right sides, which is beneficial to narrowing the non-display areas at the left and right sides, and further improving the screen occupancy ratio.

Figure 10:
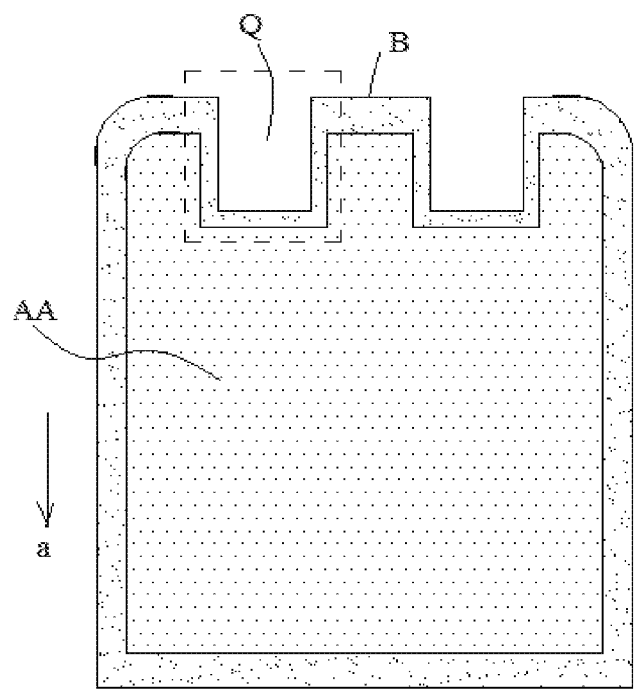
FIG. 10 is a schematic diagram of an array substrate according to still another embodiment of the present disclosure.

Further, in some embodiments, FIG. 10 is a schematic diagram of an array substrate according to still another embodiment of the present disclosure. As shown in FIG. 10, the array substrate includes at least one notch Q, for example, as shown in FIG. 10, the array substrate includes two notches Q, the array substrate includes an edge B, and the edge B recesses along the first direction a toward the display area AA to form the notches Q. It should be noted that all the array substrates described in the above embodiments may include a notch Q. The number of the notches Q of the array substrate may be selected according to the design requirements of the display panel. For example, the notch Q may be used to arrange a camera, an earpiece, or the like of the display device.

Further, in some embodiments, the notch may have a rectangle shape as shown in FIG. 10, or other shapes, such as trapezoid, arc, and etc. In practical application, the shape of the notch can be reasonably designed according to the design requirements, so as to improve the screen occupancy ratio, for example, the notch for the camera can be designed into a circular arc shape.

Figure 11:
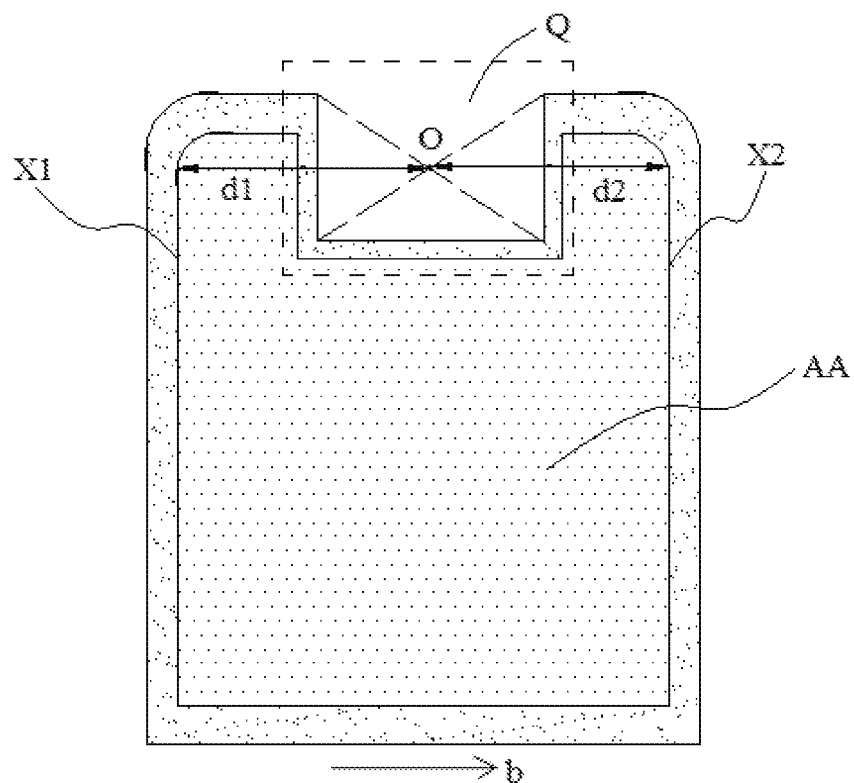
FIG. 11 is a schematic diagram of an array substrate according to still another embodiment of the present disclosure.

Further, all the array substrate described in the above embodiments may include a notch, and only the array substrate shown in FIG. 9 is taken as an example. FIG. 11 is a schematic diagram of an array substrate according to still another embodiment of the present disclosure. As shown in FIG. 11, the array substrate includes a notch Q, and for example, the notch Q has a rectangle shape. In the second direction b, the display area AA includes a first edge X1 and a second edge X2. A difference between a center of the notch Q and the first edge X1 is a first distance d1, a distance between the center of the notch Q and the second edge X2 is a second distance d2, where the first distance d is equal to the second distance d2. In this embodiment, only once wiring of the signal line in the corner non-display area is provided, which is beneficial to narrowing of the non-display area, thereby improving the screen occupancy ratio, meanwhile, the first distance d1 is equal to the second distance d2, then the notch Q of the array substrate is disposed at the center of an edge of the array substrate, therefore, when the display panel is manufactured, the display panel has a symmetrical structure as a whole, and thus the product has a good visual experience, and components such as a camera, an earpiece, a sensor and the like can be collectively disposed at the notch, which realizes centralized use of non-display area space, and thus beneficial to improving the screen occupancy ratio.

Figure 12:
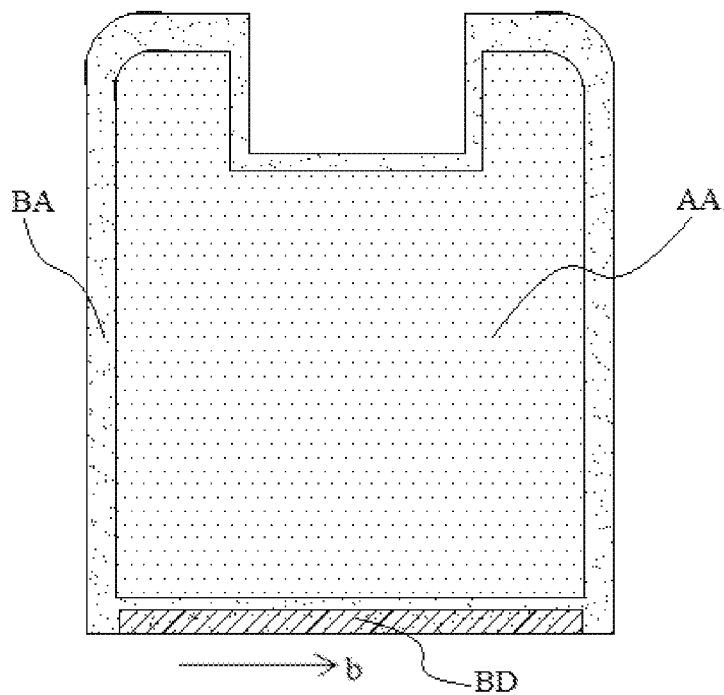
FIG. 12 is a schematic diagram of an array substrate according to still another embodiment of the present disclosure.

Further, in some embodiments, FIG. 12 is a schematic diagram of an array substrate according to still another embodiment of the present disclosure. As shown in FIG. 12, for example, the array substrate includes one notch, the array substrate includes a display area AA and a non-display area BA. The non-display area BA includes a binding area BD extending along the second direction b. The binding area BD is used for binding a flexible circuit board, and the flexible circuit board is provided with integrated circuit components. The flexible circuit board is a COF (Chip On Film) flexible circuit board. The array substrate provided by this embodiment can realize narrowing of the corner non-display area, meanwhile, the binding area BD for binding the COF flexible circuit board is arranged in the non-display area at the lower side of the array substrate, and thus reducing the design for the integrated circuit chip in the non-display area at the lower side, which is beneficial to narrowing of the lower side. It should be noted that the array substrate in this embodiment may not include a notch.

Figure 13:
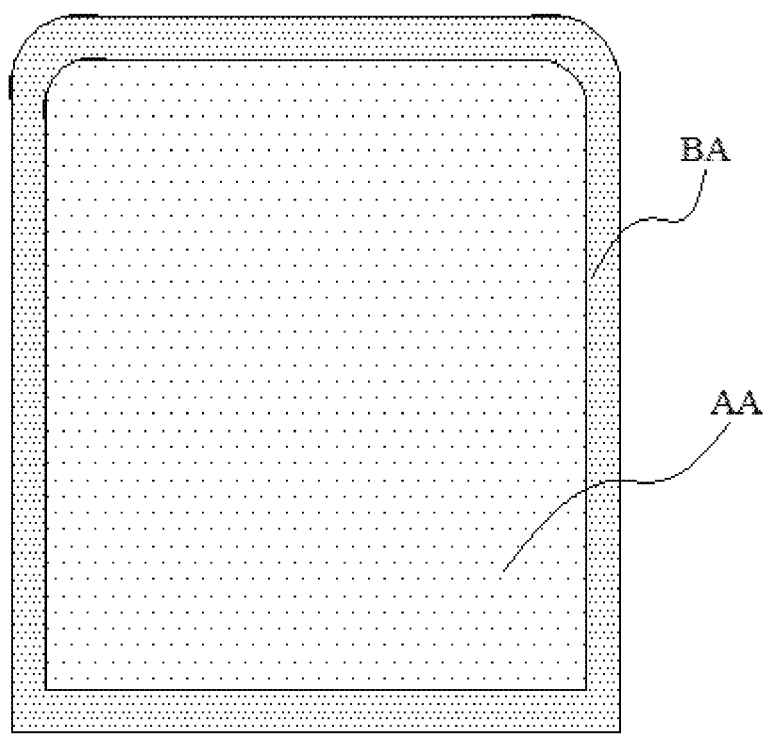
FIG. 13 is a schematic diagram of a display panel according to an embodiment of the present disclosure.

Further, the present disclosure further provides a display panel including the array substrate according to any of the above embodiments, and FIG. 13 is a schematic diagram of a display panel according to an embodiment of the present disclosure. Taking the display panel shown in FIG. 14 as an example, the display panel includes a display area AA and a non-display area BA (i.e., a border area). Compared with the related art, the first signal line section in the this embodiment for providing a signal to the data end circuit does not need to bypass the first shift register and is then connected to the data end circuit, and it requires for only once wiring of the signal line in the first corner non-display area, the wiring of the signal line in the non-display area of the array substrate is adjusted so as to reduce space occupied by the signal line in the first corner non-display area, which is beneficial to narrowing of the non-display area and thereby improving the screen occupancy ratio.

It can be seen from the above embodiments that the array substrate and the display panel of the present disclosure can achieve the following beneficial effects.

For the array substrate and the display panel provided by the present disclosure, in the first corner non-display area of the array substrate, the data end circuit is disposed at a side of the first shift register close to the display area, and the first signal line section connected to the data end circuit is disposed at the side of the first shift register close to the display area. The first signal line section of the array substrate that provides a signal for the data end circuit does not need to bypass the first shift register and is then connected to the data end circuit, and it requires for only once wiring of the signal line in the first corner non-display area, thereby reducing space occupied by the signal line in the corner non-display area, and thus achieving narrowing of the non-display area (i.e., the border), increasing the screen occupancy ratio.

What is claimed is:

1. An array substrate, comprising:
a display area and a non-display area surrounding the display area,
wherein the display area comprises a first corner, and a plurality of data lines extending along a first direction and a plurality of gate lines extending along a second direction are provided in the display area, and the first direction intersects with the second direction;
wherein the non-display area comprises: a first non-display area, a second non-display area and a first corner non-display area, the first corner non-display area is adjacent to the first non-display area and the second non-display area, the first non-display area extends along the first direction, and the second non-display area extends along the second direction;
wherein the first corner non-display area is adjacent to the first corner, and at least one data end circuit, at least one first signal line section and at least one first shift register are disposed in the first corner non-display area, the at least one data end circuit is disposed at a side of the at least one first shift register close to the display area, and the at least one first signal line section corresponding to and connected to the at least one data end circuit is located at the side of the at least one first shift register close to the display area;
wherein at least one second signal line section and at least one second shift register are provided in the first non-display area, and the second signal line section is located at a side of the at least one second shift register away from the display area;
wherein the second signal line section is connected to the first signal line section through a first bridge line so as to provide a signal to the at least one data end circuit, and the first bridge line is located in a metal layer different from metal layers where the first signal line section and the second signal line section are located; and
wherein one of the at least one first shift register is connected to at least one of the plurality of gate lines; and one of the at least one second shift register is connected to at least one of the plurality of gate lines.

2. The array substrate according to claim 1, wherein the first bridge line is located in the first non-display area.

3. The array substrate according to claim 2, wherein an orthographic projection of the first bridge line on a plane, where each of the at least one second shift register is located, is located between two adjacent second shift registers.

4. The array substrate according to claim 1, wherein the display area further comprises a second corner, and the non-display area further comprises a third non-display area, a fourth non-display area, and a second corner non-display area;
wherein the second corner non-display area is adjacent to the third non-display area and the fourth non-display area, the third non-display area and the first non-display area are located at two opposite sides of the display area, and the second non-display area and the fourth non-display area are located at a same side of the display area; and wherein the second corner non-display area is adjacent to the second corner, the at least one data end circuit, the at least one first signal line section and the at least one first shift register are provided in the second corner non-display area, wherein the at least one data end circuit is disposed at a side of the at least one first shift register close to the display area, and the first signal line section corresponding to and connected to the at least one data end circuit is located at the side of the at least one first shift register close to the display area.

5. The array substrate according to claim 4, wherein at least one second signal line section and at least one second shift register are provided in the third non-display area, and the second signal line section is located at a side of the at least one second shift register close to the display area, and wherein the second signal line section is connected to the first signal line section in the second corner non-display area.

6. The array substrate according to claim 4, wherein at least one second signal line section and at least one second shift register are provided in the third non-display area, and the second signal line section is located at a side of the at least one second shift register away from the display area, and wherein the second signal line section is connected to the first signal line section in the second corner non-display area through a second bridge line, and the second bridge line is located in a metal layer different from metal layers where the first signal line section and the second signal line section are located.

7. The array substrate according to claim 1, wherein the array substrate comprises at least one notch, and wherein the array substrate comprises an edge, and the edge recesses toward the display area along the first direction to form the notch.

8. The array substrate according to claim 7, wherein the array substrate comprises one notch, and wherein in the second direction, the display area comprises a first edge and a second edge opposite to the first edge, a distance between a center of the notch and the first edge is a first distance, a distance between the center of the notch and the second edge is a second distance, and the first distance is equal to the second distance.

9. The array substrate according to claim 7, wherein the notch has a rectangle shape, a trapezoid shape or a circular arc shape.

10. The array substrate according to claim 1, wherein the at least one data end circuit is an anti-static circuit, and the anti-static circuit is connected to the plurality of data lines.

11. The array substrate according to claim 1, wherein the array substrate comprises a common electrode, each of the at least one data end circuit is a common voltage switch control circuit, and the common voltage switch control circuit is connected to the common electrode.

12. The array substrate according to claim 1, wherein the non-display area further comprises a binding area extending along the second direction, the binding area is used for binding a flexible circuit board, on which integrated circuit components are fixed.

13. A display panel, comprising:
an array substrate, wherein the array substrate comprises a display area and a non-display area surrounding the display area,
wherein the display area comprises a first corner, and a plurality of data lines extending along a first direction and a plurality of gate lines extending along a second direction are provided in the display area, and the first direction intersects with the second direction;
wherein the non-display area comprises: a first non-display area, a second non-display area and a first corner non-display area, the first corner non-display area is adjacent to the first non-display area and the second non-display area, the first non-display area extends along the first direction, and the second non-display area extends along the second direction;
wherein the first corner non-display area is adjacent to the first corner, and at least one data end circuit, at least one first signal line section and at least one first shift register are disposed in the first corner non-display area, the at least one data end circuit is disposed at a side of the at least one first shift register close to the display area, and the at least one first signal line section corresponding to and connected to the at least one data end circuit is located at the side of the at least one first shift register close to the display area;
wherein at least one second signal line section and at least one second shift register are provided in the first non-display area, and the second signal line section is located at a side of the at least one second shift register away from the display area;
wherein the second signal line section is connected to the first signal line section through a first bridge line so as to provide a signal to the at least one data end circuit, and the first bridge line is located in a metal layer different from metal layers where the first signal line section and the second signal line section are located; and
wherein each of the at least one first shift register is connected to at least one of the plurality of gate lines, and each of the at least one second shift register is connected to at least one of the plurality of gate lines.

* * * * *